United States Patent
Ramanath et al.

(10) Patent No.: US 11,262,734 B2
(45) Date of Patent: Mar. 1, 2022

(54) SYSTEMS AND METHODS TO ENSURE ROBUSTNESS FOR ENGINEERING AUTONOMY

(71) Applicants: Siemens Aktiengesellschaft, Munich (DE); Siemens Technology and Services Pvt. Ltd., Mumbai (IN); Siemens Energy, Inc., Orlando, FL (US)

(72) Inventors: Vinay Ramanath, Charlotte, NC (US); Christopher Bachman, Charlotte, NC (US); Anant Kumar Mishra, Charlotte, NC (US); Himanshu Bhatnagar, Charlotte, NC (US)

(73) Assignee: Siemens Aktiengesellschaft, Munich (DE)

( * ) Notice: Subject to any disclaimer, the term of this patent is extended or adjusted under 35 U.S.C. 154(b) by 810 days.

(21) Appl. No.: 16/115,602

(22) Filed: Aug. 29, 2018

(65) Prior Publication Data

US 2020/0073373 A1   Mar. 5, 2020

(51) Int. Cl.
*G05B 19/418* (2006.01)
*G06F 30/23* (2020.01)
*G06F 17/18* (2006.01)
*G06N 7/00* (2006.01)

(52) U.S. Cl.
CPC ....... *G05B 19/41875* (2013.01); *G06F 17/18* (2013.01); *G06F 30/23* (2020.01); *G06N 7/005* (2013.01)

(58) Field of Classification Search
CPC ... G05B 19/41875; G06F 30/23; G06F 30/00; G06F 17/18; G06F 30/20; G06N 7/005

USPC ........................................................... 703/2
See application file for complete search history.

(56) References Cited

PUBLICATIONS

Sun, Guangyong et al., "Crashworthiness Design of Vehicle by Using Multiobjective Robust Optimization", 2011, Struct Multidisc Optim, Springer-Verlag. (Year: 2011).*
Liao, Xingtao et al., "Multiobjective Optimization for Crash Safety Design of Vehicles Using Stepwise Regression Model", 2008, Struct Multidisc Optim, Springer-Verlag. (Year: 2008).*

(Continued)

*Primary Examiner* — Cedric Johnson

(57) ABSTRACT

Methods and systems are provided for evaluating robustness of engineering components. An example method includes receiving an engineering problem definition for a multidimensional engineering domain of an engineering component, in which the engineering problem definition includes a description of a plurality of engineering features of the engineering component. Executing an optimal stratified sampling algorithm that obtains a plurality of probabilistic samples from the multidimensional engineering domain. Selecting optimal combinations of higher fidelity models, reduced order models and response surfaces for execution of the probabilistic samples. Executing the probabilistic samples using the selected combinations to determine a respective engineering response for each engineering feature of the plurality of engineering features. Generating a robustness scorecard for the engineering component based on the determined engineering responses to quantify a robustness score for each engineering feature of the plurality of engineering features. Presenting the robustness scorecard to a user.

17 Claims, 8 Drawing Sheets

(56) References Cited

PUBLICATIONS

Yang, Ren-Jye et al., "Robust Optimization for Vehicular Crash Simulations", Nov./Dec. 2000, CSE in Industry. (Year: 2000).*
Elias, Jan et al., "Modification of the Audze-Eglajs Criterion to Achieve a Uniform Distribution of Sampling Points", Jul. 20, 2016, Advances in Engineering Software 100, Elsevier Ltd. (Year: 2016).*
EP Search Report dated Jan. 8, 2020; European patent application No. 19 194 129.3; 7 pages.
Sun G. et al: "Crashworthiness design of vehicle by using multiobjective robust optimization"; Structural and Multidisciplinary Optimization; vol. 44, No. 1, Dec. 24, 2010 (Dec. 24, 2010), pp. 99-110, XP019912192; ISSN: 1615-1488, DOI: 10.1007/S00158-010-0601-Z.
Yang R-J. et al: "Robustness optimization for vehicular crash simulations", Computing in Science and Engineering; vol. 2, No. 6, Nov. 2000 (Nov. 2000); pp. 8-13, XP002955720; ISSN: 1521-9615, DOI: 10.1109/5992.881701.

* cited by examiner

SYSTEMS AND METHODS TO ENSURE ROBUSTNESS FOR ENGINEERING AUTONOMY

BACKGROUND

The present invention generally relates to sampling systems, and more specifically, to systems for evaluating robustness of an engineering product via optimal stratified sampling of a multidimensional design space.

Safety factors are often utilized to minimize the likelihood that an engineering product will fail. Safety factors assist in guarding against variations to ensure robust engineering products. The use factors of safety is often limited by several technical problems. For example, factors of safety are not known a priori and are often highly dependent on the complexity of the analyzed engineering system. As such, use of factors of safety often leads to excessive conservatism in engineering calculations.

Derivative approaches have also been utilized to analyze robustness of an engineering product. These derivative approaches sometimes involve evaluating derivatives or slopes around key design points and then deriving sensitivity metrics from derivative data. Based on this approach, the design points for responses that display the least sensitivities are deemed to be the most robust from an engineering stand point. Derivative approaches primarily require, however, that the system make an assumption that the engineering responses obtained are both differentiable and continuous, which often times is not actually true. These types of derivative approaches are not valid for an entire engineering domain as the derivative approaches only yield a local solution for robustness.

Monte Carlo (MC) based approaches have also been utilized to analyze robustness of an engineering product. This approach generally involves propagating a variance from an input variable space to response spaces by employing MC sampling techniques to quantify a response variation. MC based sampling for robustness evaluation is limited by several technical issues. For example, MC based sampling approaches do not scale well as the number of dimensions increase. Moreover, MC based sampling approaches expend a significant amount of computational resources and lack the ability to handle non-normal response distributions for modeling and displaying variances.

The terms "Monte Carlo", "MC," and "Simple Random Sampling" are referenced interchangeably herein.

SUMMARY

Embodiments of the present invention provide a computer-implemented method for concurrency conflict testing for evaluating robustness of engineering components. A non-limiting example of the computer-implemented method includes receiving, by a system comprising one or more processors, an engineering problem definition for a multi-dimensional engineering domain of an engineering component, in which the engineering problem definition includes a description of a plurality of engineering features of the engineering component. The method includes executing, by the system, an optimal stratified sampling algorithm that obtains a plurality of probabilistic samples from the multi-dimensional engineering domain. The method includes selecting, by the system, combinations of higher fidelity models, reduced order models, and response surfaces for execution of the obtained probabilistic samples. The method includes executing, by the system, the obtained probabilistic samples using the selected combinations to determine a respective engineering response for each engineering feature of the plurality of engineering features. The method includes generating, by the system, a robustness scorecard for the engineering component based on the determined engineering responses to quantify a robustness score for each engineering feature of the plurality of engineering features. The method includes presenting, by the system, the robustness scorecard to a user via a graphical user interface of a user device.

Embodiments of the present invention provide a system for evaluating robustness of engineering components. The system includes one or more processors that are configured to perform a method. A non-limiting example of the method includes receiving, by the system, an engineering problem definition for a multidimensional engineering domain of an engineering component, in which the engineering problem definition includes a description of a plurality of engineering features of the engineering component. The method includes executing, by the system, an optimal stratified sampling algorithm that obtains a plurality of probabilistic samples from the multidimensional engineering domain. The method includes selecting, by the system, combinations of higher fidelity models, reduced order models, and response surfaces for execution of the obtained probabilistic samples. The method includes executing, by the system, the obtained probabilistic samples using the selected combinations to determine a respective engineering response for each engineering feature of the plurality of engineering features. The method includes generating, by the system, a robustness scorecard for the engineering component based on the determined engineering responses to quantify a robustness score for each engineering feature of the plurality of engineering features. The method includes presenting, by the system, the robustness scorecard to a user via a graphical user interface of a user device.

Embodiments of the invention provide a computer program product for evaluating robustness of engineering components, the computer program product comprising a computer readable storage medium having program instructions embodied therewith. The program instructions are executable by a system comprising one or more processors to cause the system to perform a method. A non-limiting example of the method includes receiving, by the system, an engineering problem definition for a multidimensional engineering domain of an engineering component, in which the engineering problem definition includes a description of a plurality of engineering features of the engineering component. The method includes executing, by the system, an optimal stratified sampling algorithm that obtains a plurality of probabilistic samples from the multidimensional engineering domain. The method includes selecting, by the system, combinations of higher fidelity models, reduced order models, and response surfaces for execution of the obtained probabilistic samples. The method includes executing, by the system, the obtained probabilistic samples using the selected combinations to determine a respective engineering response for each engineering feature of the plurality of engineering features. The method includes generating, by the system, a robustness scorecard for the engineering component based on the determined engineering responses to quantify a robustness score for each engineering feature of the plurality of engineering features. The method includes presenting, by the system, the robustness scorecard to a user via a graphical user interface of a user device.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
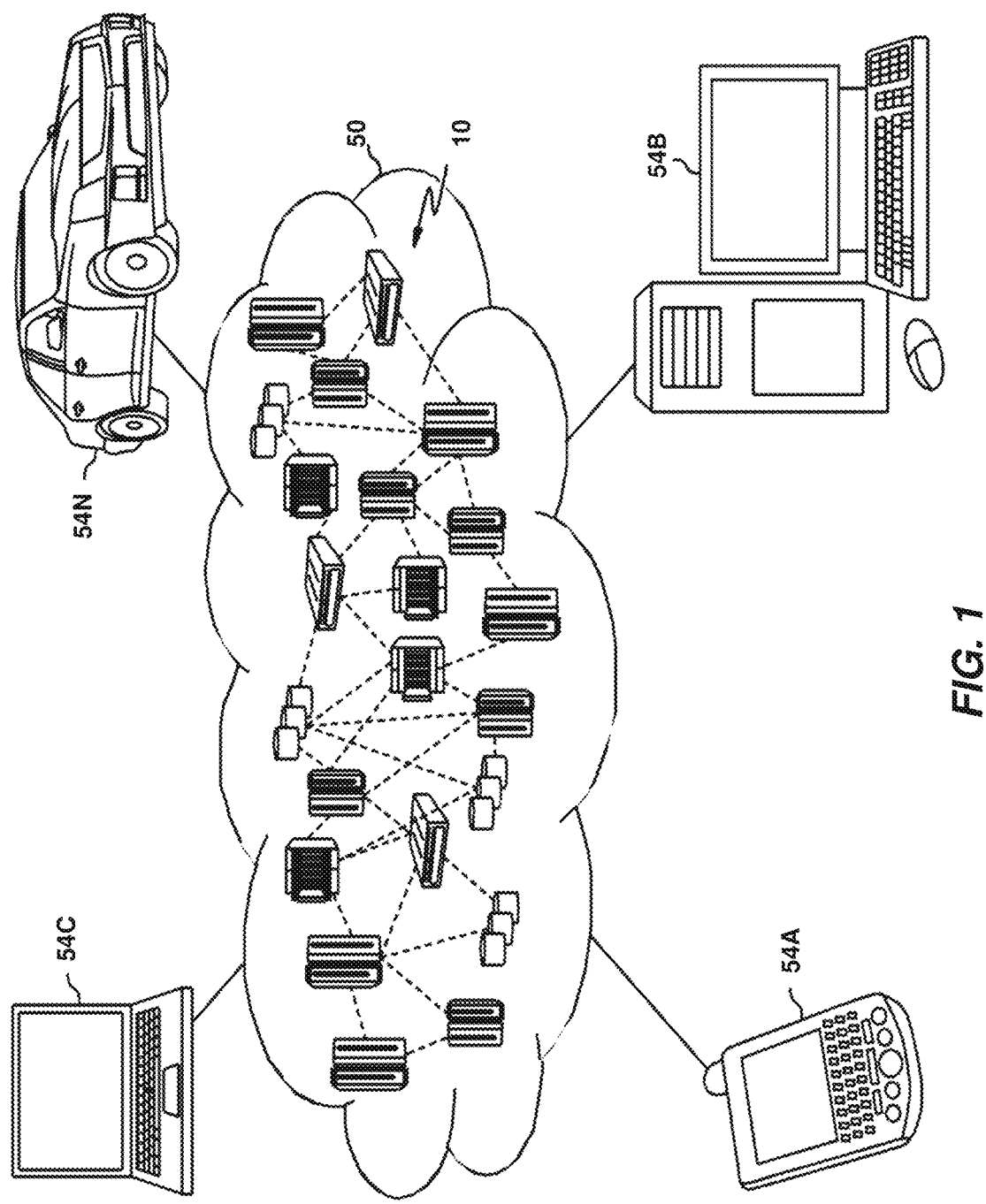
FIG. 1 depicts a cloud computing environment according to one or more embodiments of the present invention.

The diagrams depicted herein are illustrative. There can be many variations to the diagram or the operations described therein without departing from the spirit of the invention. For instance, the actions can be performed in a differing order or actions can be added, deleted, or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems; storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms, and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
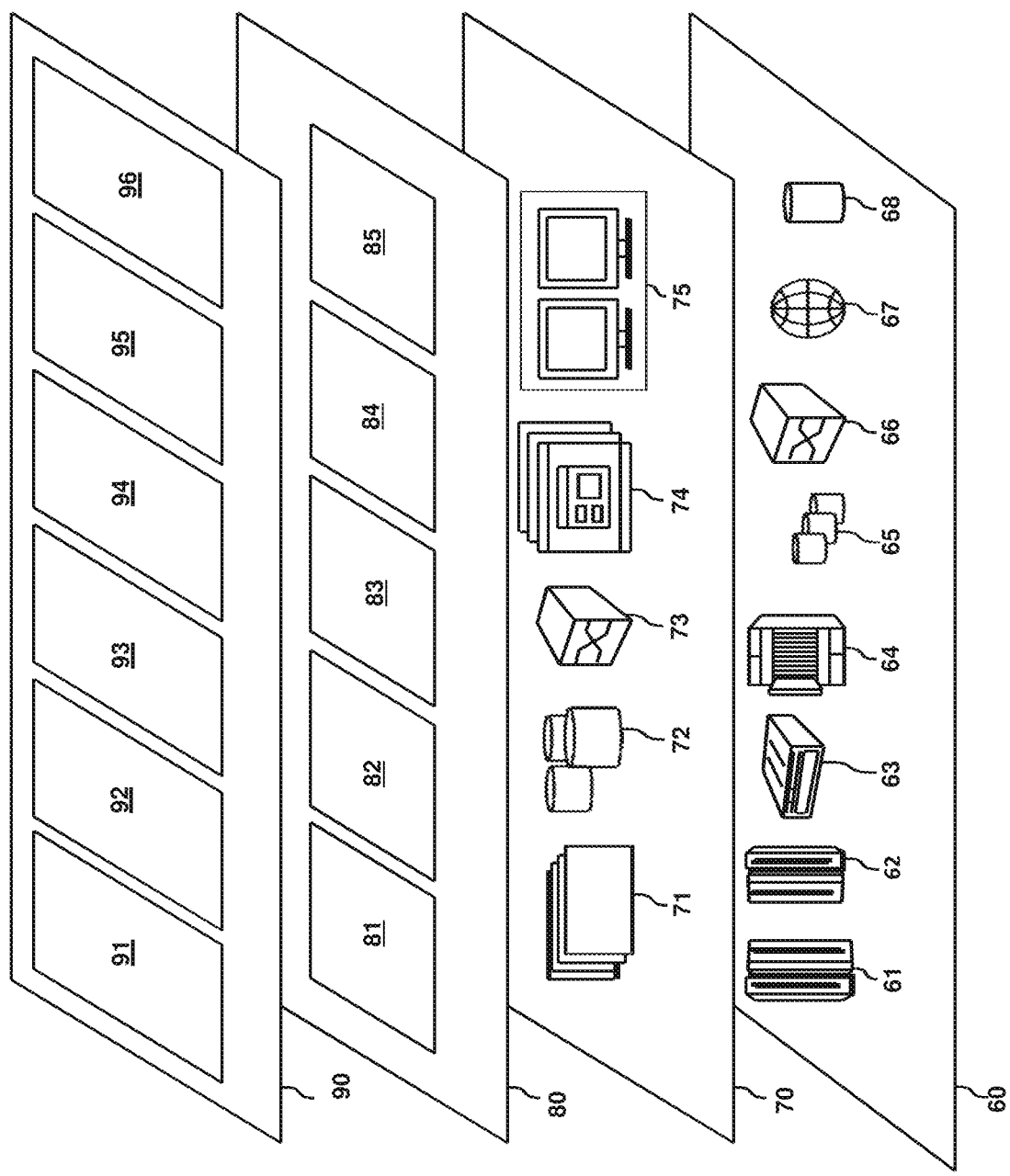
FIG. 2 depicts abstraction model layers according to one or more embodiments of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and robustness evaluation processing 96.

Turning now to an overview of the aspects of the invention, one or more embodiments of the invention address shortcomings of the prior art by providing a system and methodology that can be utilized to ensure robustness of engineering systems for the end objective of achieving autonomy in decision making. This is achieved based in part on performing a probabilistic sampling scheme that is based on an optimal stratified sampling technique (e.g., Optimal Latin Hypercube). The use of the optimal stratified sampling scheme enables the system to explore non-uniform spaces in an efficient and improved manner. In particular, given a problem in temporal and spatial domain, in some embodiments of the present invention, the system performs probabilistic sampling across a global design space of interest to estimate the random variable distributions in an N-dimensional space (e.g., a multidimensional engineering design space), in which the sampling is performed via Optimal Latin Hypercube (OLH). The terms "Optimal Latin Hypercube," "OLH," and "Optimal Stratified Sampling" are referenced interchangeably herein.

In some embodiments of the present invention, a multifidelity approach is then executed by the system based on preferences set by a user and/or preferences set a priori by the system. As part of the multifidelity approach, the system chooses optimal combinations of higher fidelity models, reduced order models, and response surfaces for execution of probabilistic samples. In some embodiments of the present invention, the system then generates a robustness scorecard that is used to quantify the robustness of engineering concepts (e.g., feature positions of an engineering component). For example, in some embodiments of the present invention, an automated set of statistical calculations for computation of the z-scores is utilized. A z-score is a reflection of robustness score for an engineering concept. The algorithm will in real time, decide the normality of engineering data and autonomously chose the right evaluation for robustness score estimation.

In some embodiments of the present invention, the generation of the robustness scorecard includes analyzing the statistical correctness of probabilistic samples to look into normality of the response data. In some embodiments of the present invention, the system selects an appropriate computation engine for estimation of robustness scores, in which the selection is based on whether the underlying data is normally distributed. In some embodiments of the present invention, the scorecard will include a ranking system that evaluates each concept vis-à-vis engineering robustness. In some embodiments of the present invention, the system iterates through the process to conduct further sampling until an acceptable criteria is reached, in which the criteria defines acceptable probability of failure or an acceptable error in variance estimation.

In some embodiments of the present invention, visualizations of robustness are then presented to a user via an advanced visualization scheme. This advanced visualization scheme can be used to aid the user during the engineering decision making process by providing real time informatics on the engineering robustness of a particular engineering product.

The above-described aspects of the invention address the shortcomings of the prior art by providing an algorithmic approach that is able to solve the problem of robustness evaluation. The process is generally autonomous and devoid of any manual intervention, except for potential interactions through dashboards and/or visual reports. As the process is self-driven, subjectivity is eliminated and standardization is brought in, thereby making the process repeatable, reproducible, and enabled with data driven decisions. As noted above, the algorithmic approach uses OLH to explore a multidimensional engineering design space, which in some embodiments of the present invention is a non-uniform space. These advanced space filling sampling techniques have been proven by the present inventors to have the least error in variance estimation with maximum efficiency in computation (e.g., least number of expensive computations) as compared to certain prior techniques. OHL samples can derive reasonable estimates of variances at a faster rate than compared to prior MC approaches. For example, the present inventors have identified that executing an MC approach would take almost 10 times as long as OLH to result in similar variance estimates.

As efficient estimation of variances is critical for accurate calibration of robustness, especially in higher dimensions bounded by joint probability distributions, the engineering user will be able to accurately quantify the variance estimates of highly nonlinear engineering responses in accordance with one or more embodiments of the present invention. Since the metric for evaluating robustness is nonlinear and dependent on variance, deviation from "actual" estimates may cause the robustness calculation to drive away from a normal course. As noted above, engineering users will be able to automatically generate robustness scores with no manual feeding, which leads to autonomy in engineering decision making. The method will auto-generate and populate robustness charts and provide a summary of key observations. For example, the method may perform visual analytics for deriving robustness metrics and then provide results of the analytics to the user via display screen of a user device associated with the user.

Several benefits may be achieved by performing one or more embodiments of the present invention. For example, engineers working on engineering products will be able to evaluate the robustness of engineering concepts in real time, thus improving the overall effectiveness in R&D and engineering effort, which can lead to engineering autonomy. Performance of one or more embodiments of the present invention can lead to a reduction in engineering cycle time and an acceleration of the speed of deployment of products to a marketplace. Early detection of failures and root cause analysis will be streamlined by the application of robustness evaluation. In accordance with one or more embodiments of the present invention, engineers will be able to more readily detect and identify component failures and/or product failures based on the robustness of the evaluated concepts. Parameters that are detected by one or more embodiments of the present invention as causing manufacturing deviations can be better understood through this approach and hence mechanisms can be devised to avoid them proactively, thus leading to a reduction in rejected parts.

Devising a suitable sampling algorithm is key to accurate estimation of robustness in engineering. Here, as noted above, a sampling algorithm based on optimal configuration of space filling samples (OLH) is utilized. A normalized multidimensional design space is divided into smaller substances with a technique called Latin Hypercube. The division of the strata is determined according to the type of distributions specified on the variables of interest. One sample out of each subspace is picked out during this process such that there are no other samples with a same coordinate. This way the information extracted during Design Space Exploration (DOE) is maximized through the least amount of samples possible. In some embodiments of the present invention, for evaluations around a particular Region of Interest (ROI), the Latin Hypercube is compressed such that more information may be extracted around the ROI without losing the overview of designs that are further away from the ROI. In some embodiments of the present invention, this compressed hypercube is then employed in conjunction with an optimizer to create an optimal set of configurable samples across the engineering design space of interest. The present inventors have identified that the use of OLH provides better results in comparison to MC and Random Latin Hypercube (RLH) approaches when seeking to maximize the efficiency of variance estimations conducted on complex engineering systems. The terms "Random Latin Hypercube," "RLH," and "Stratified Random Sampling" are referenced interchangeably herein.

For example, the present inventors have discovered that sampling through the use of MC for a particular test case results in generating samples having a large number of void regions, whereas the use of RLH generated fewer void regions and OLH generating no void regions. The absence of voids in OLH leads to a better sampling across the ROI, which leads to a more accurate estimation of sensitivity. Tables 1 and 2 below illustrate proof of a test case showing OLH outperforming RLH and MC. Table 1 show results for a range of 50 samples, whereas Table 2 shows results for a range of 100 samples.

TABLE 1

Research Results of a Numerical Sampling Coverage for Monte Carlo, Random Latin Hypercube and Optimal Latin Hypercube for a Range of 50 Samples

| Sampling Method | Minimum Force | mM Lower Value Desired | Mm Higher Value Desired |
| --- | --- | --- | --- |
| MC | 31938 | 1.15 | 0.01 |
| RLH | 17875 | 1.28 | 0.02 |
| OLH | 10597 | 1.13 | 0.10 |

TABLE 2

Research Results of a Numerical Sampling Coverage for Monte Carlo, Random Latin Hypercube and Optimal Latin Hypercube for a Range of 100 Samples

| Sampling Method | Minimum Force | mM Lower Value Desired | Mm Higher Value Desired |
| --- | --- | --- | --- |
| MC | 167590 | 8.70 | 0.028 |
| RLH | 122703 | 10.80 | 0.08 |
| OLH | 53296 | 8.68 | 0.248 |

Table 3 below illustrates results from the study that compared the variance estimates of RLH (a random stratified sampling technique), MC (a simple random sampling technique), and OLH (an optimal stratified sampling technique) at four sampling ranges (i.e., number of samples 50, 300, 500, and 1000). In this study, assumptions include that standard deviation estimates are from 10,000 simulations (25.4 units) and that MC sampling is the standard benchmark for comparison.

TABLE 3

Research Results from comparing Variances Estimates for Monte Carlo, Random Latin Hypercube and Optimal Latin Hypercube

| | Stratified Random Sampling | | Optimal Stratified Sampling | | Simple Random Sampling | |
| --- | --- | --- | --- | --- | --- | --- |
| | Stdev | % Error in Stdev estimates | Stdev | % Error in Stdev estimates | Stdev | % Error in Stdev estimates |
| Y-50 Samples | 28.37 | −11.70 | 24.8 | 2.36 | 32.76 | −28.98 |
| Y-300 Samples | 27.75 | −9.25 | 25 | 1.57 | 30 | −18.11 |
| Y-500 Samples | 24.67 | 2.88 | 25.1 | 1.18 | 29.55 | −16.34 |
| Y-1000 Samples | 25.31 | 0.36 | 25.32 | 0.31 | 29.1 | −14.57 |

It can be observed in Table 3 that optimal stratified sampling (i.e., OLH) provides better estimates of variance even at lower sampling ranges with higher degree of predictability, and that 500 simulations of stratified random sampling (i.e., RLH) provides the same statistical effects as 50 simulations of optimal stratified sampling. This proves the efficiency of OLH in estimating accurate variances of engineering responses in comparison to RLH and MC.

Figure 3:
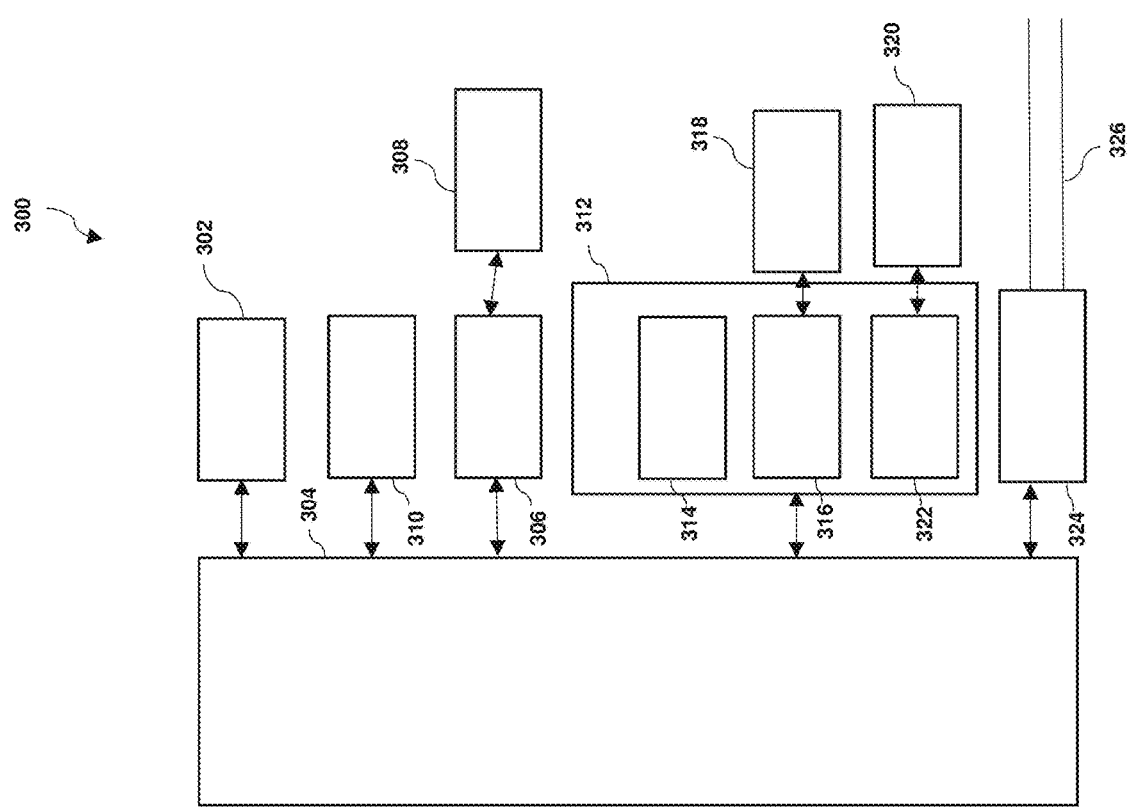
FIG. 3 depicts an exemplary computer system capable of implementing one or more embodiments of the present invention.

Turning now to a more detailed description of aspects of the present invention, FIG. 3 illustrates a high-level block diagram showing an example of a computer-based system 300 that can be used to implement one or more embodiments of the invention. Although one exemplary computer system 300 is shown, computer system 300 includes a communication path 326, which connects computer system 300 to additional systems and may include one or more wide area networks (WANs) and/or local area networks (LANs) such as the internet, intranet(s), and/or wireless communication network(s). Computer system 300 and additional systems are in communication via communication path 326, (e.g., to communicate data between them).

Computer system 300 includes one or more processors, such as processor 302. Processor 302 is connected to a communication infrastructure 304 (e.g., a communications bus, cross-over bar, or network). Computer system 300 can include a display interface 306 that forwards graphics, text, and other data from communication infrastructure 304 (or from a frame buffer not shown) for display on a display unit 308. Computer system 300 also includes a main memory 310, preferably random access memory (RAM), and may also include a secondary memory 312. Secondary memory 312 may include, for example, a hard disk drive 314 and/or a removable storage drive 316, representing, for example, a floppy disk drive, a magnetic tape drive, or an optical disk drive. Removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc., which is read by and written to by a removable storage drive 316. As will be appreciated, removable storage unit 318 includes a computer readable medium having stored therein computer software and/or data.

In some alternative embodiments of the invention, secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM or PROM) and associated socket, and other removable storage units 320 and interfaces 322 which allow software and data to be transferred from the removable storage unit 320 to computer system 300.

Computer system 300 may also include a communications interface 324. Communications interface 324 allows software and data to be transferred between the computer system and external devices. Examples of communications interface 324 may include a modem, a network interface (such as an Ethernet card), a communications port, or a PCM-CIA slot and card, etc. Software and data transferred via communications interface 324 are in the form of signals which may be, for example, electronic, electromagnetic, optical, or other signals capable of being received by communications interface 324. These signals are provided to communications interface 324 via communication path (i.e., channel) 326. Communication path 326 carries signals and may be implemented using a wire or cable, fiber optics, a phone line, a cellular phone link, an RF link, and/or other communications channels.

In the present disclosure, the terms "computer program medium," "computer usable medium," and "computer readable medium" are used to generally refer to media such as main memory 310 and secondary memory 312, removable storage drive 316, and a hard disk installed in hard disk drive 314. Computer programs (also called computer control logic) are stored in main memory 310, and/or secondary memory 312. Computer programs may also be received via communications interface 324. Such computer programs, when run, enable the computer system to perform the features of the present disclosure as discussed herein. In particular, the computer programs, when run, enable processor 302 to perform the features of the computer system. Accordingly, such computer programs represent controllers of the computer system.

Figure 4:
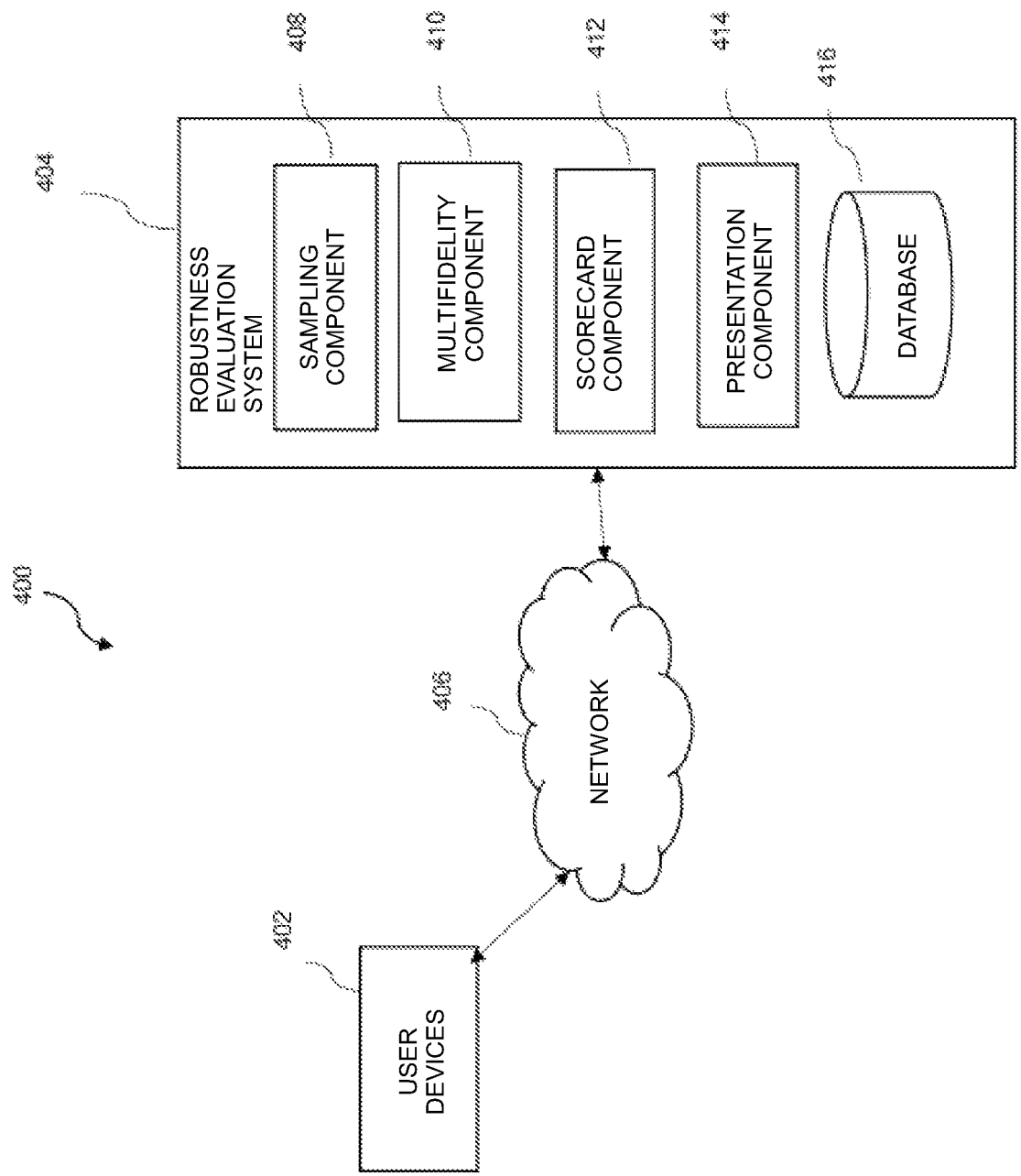
FIG. 4 depicts an example distributed environment for evaluating robustness of engineering components in accordance with one or more embodiments of the present invention.

Referring now to FIG. 4, an example distributed environment 400 is presented for evaluating robustness of engineering components. Distributed environment 400 includes a robustness evaluation system 404, and in some embodiments of the present invention includes one or more user devices 402, which are interconnected via network 406. FIG. 4 provides an illustration of only one example system and does not imply any limitation with regard to other systems in which different embodiments of the present invention may be implemented. Various suitable modifications to the depicted environment may be made, by those skilled in the art, without departing from the scope of the invention as recited by the claims. For example, in some embodiments of the present invention, distributed environment 400 does not include one or more user devices 402.

Robustness evaluation system 404 includes a sampling component 408, a multifidelity component 410, a scorecard component 412, a presentation component 414, and one or more databases 416. In some embodiments of the present invention, sampling component 408, multifidelity component 410, scorecard component 412, presentation component 414, and/or databases 416 are interconnected via a communication infrastructure 304 and/or communication path 326. Robustness evaluation system 404 may have internal and external hardware components, such as those depicted and described above with respect to FIG. 3.

In some embodiments of the present invention, robustness evaluation system 404 forms part of a multithreaded computer system operating in a concurrent programming environment. In general, in concurrent programming environments, a set of processes may be executed on one or more processors (e.g., processor 302). A process refers to a unit of concurrent programming (e.g., a program or section of a program). Multiple processes may execute the same section of the program simultaneously and each process may, in turn, include multiple threads. A process thread refers to a sub-element of a process or a stream of instructions simultaneously executed within the same program. In concurrent programming, a multithreading processing technique may be employed that enables two or more of the same type of transaction to be carried out simultaneously. Each stream processes a different transaction message.

In some embodiments of the present invention, robustness evaluation system 404 is a standalone computing device, a management server, a web server, a mobile computing device, or other suitable electronic device and/or computing system capable of receiving, sending, and processing data. In some embodiments of the present invention, robustness evaluation system 404 is a server computing system utilizing multiple computers, such as in cloud computing environment 50 (FIG. 1). In some embodiments of the present invention, robustness evaluation system 404 is a laptop computer, a tablet computer, a netbook computer, a personal computer (PC), a desktop computer, a personal digital assistant (PDA), a smartphone, or other suitable programmable electronic device capable of communicating with user device 402, and other computing devices (not shown) within distributed environment 400 via network 406. In some embodiments of the present invention, robustness evaluation system 404 is a computing system utilizing clustered computers and components (e.g., database server computers, application server computers, etc.) that act as a single pool of seamless resources that are accessible within distributed environment 400. Robustness evaluation system 404 may have internal and external hardware components, such as those depicted and described above with respect to FIG. 3.

Network 406 can be, for example, a telecommunications network, a local area network (LAN), a wide area network (WAN), such as the Internet, or a combination of the three, and can include wired, wireless, or fiber optic connections. Network 406 can include one or more wired and/or wireless networks that are capable of receiving and transmitting data, voice, and/or video signals, including multimedia signals that include voice, data, and video information. In general, network 406 can be any suitable combination of connections and protocols that can support communications between user device 402, robustness evaluation system 404, and/or other computing devices (not shown) within a distributed environment 400. In some embodiments of the present invention, distributed environment 400 is implemented as part of a cloud computing environment such as cloud computing environment 50 (FIG. 1).

User device 402 is configured to allow users to send and/or receive information from user device 402 to robustness evaluation system 404, which in turn allows users to access sampling component 408, multifidelity component 410, scorecard component 412, presentation component 414, and database(s) 416. In some embodiments of the present invention, user device 402 includes a user interface (UI) that is configured to present to the user a robustness scorecard the quantifies a robustness score for each engineering concept (e.g., feature position) and/or validation through visualization of engineering robustness for each concept through charts, tables, summary of key points, etc.

In some embodiments of the present invention, user device 402 is a laptop computer, a tablet computer, a netbook computer, a personal computer (PC), a desktop computer, a personal digital assistant (PDA), a smartphone, an internet-of-things (IoT) enabled device, and/or other suitable programmable electronic devices capable of communicating with various components and devices within distributed environment 400. In some embodiments of the present invention, user device 402 is a programmable electronic mobile device or a combination of programmable electronic mobile devices capable of executing machine-readable program instructions and communicating with other computing devices (not shown) within distributed environment 400. In some embodiments of the present invention, user device 402 may include internal and external hardware components, such as those depicted and described above with respect to FIG. 3.

Figure 5:
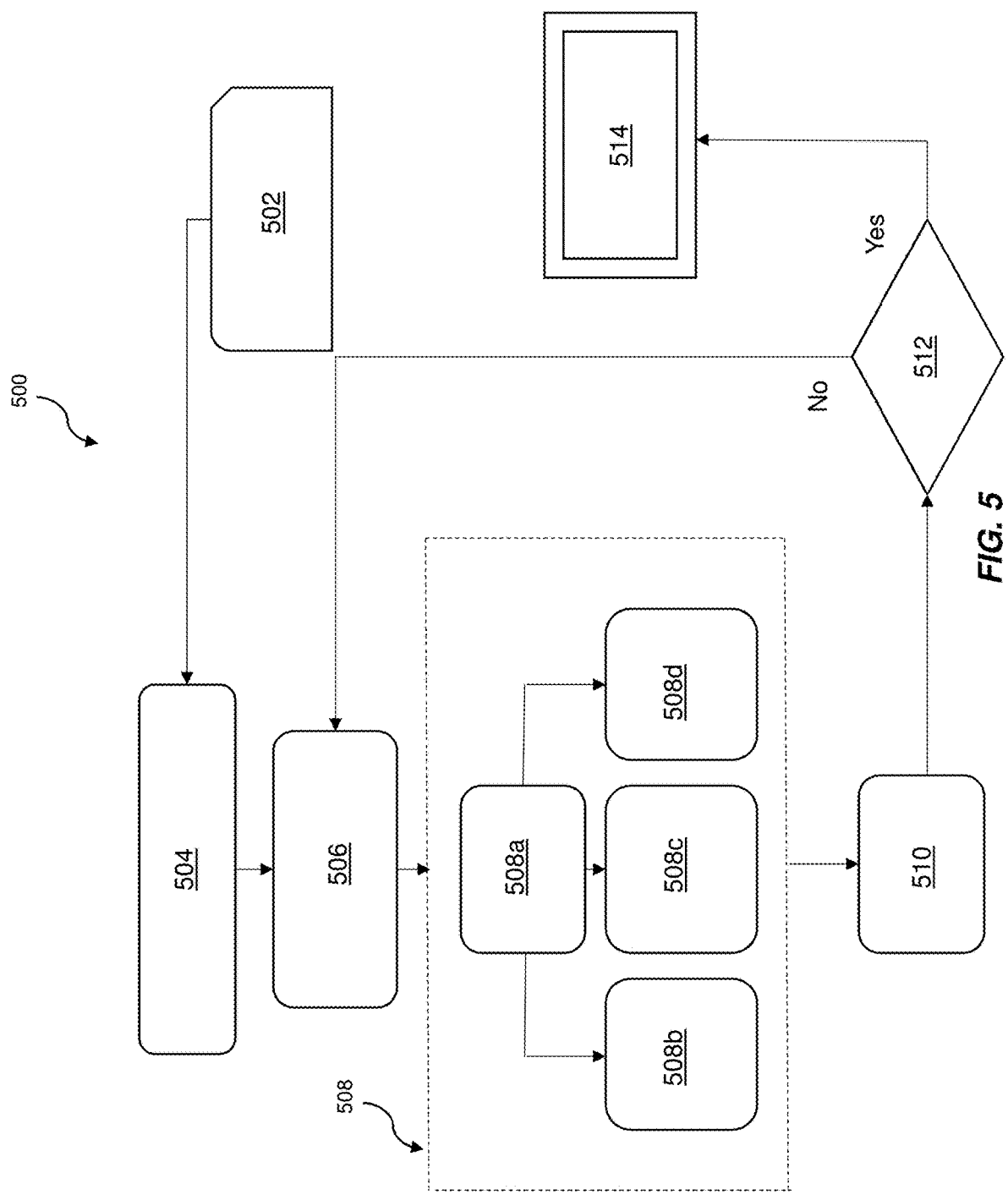
FIG. 5 depicts a flow diagram illustrating an example methodology for robustness evaluation and valuation of robustness in an N-dimensional parameter space in accordance with one or more embodiments of the present invention.

FIG. 5 illustrating an example methodology 500 that is perforable by robustness evaluation system 404 for robustness evaluation and visualization of robustness in an N-dimensional parameter space in accordance with one or more embodiments of the present invention. At 502, a problem definition and/or uncertainty model is obtained. At 504 a spatial temporal domain is obtained. At 506, a sampling algorithm is performed (e.g., via sampling component 408). At 508, a multifidelity approach is executed (e.g., via multifidelity component 410) such that an optimal combination of higher fidelity models, reduced order models, and response surfaces are selected (at 508a) and then the selected combination is executed (at 508b, 508c, 508d) to run computer simulations. For example, in some embodiments of the present invention, one or more higher fidelity models, one or more reduced order models, and/or one or more response surface models are selected at 508a. Once the models are chosen, each of selected models executes one or more portions of the probabilistic samples to obtain one or more engineering responses at 508b, 508c, and/or 508d. At 510, a robustness scorecard is generated (e.g., via scorecard component 412). At 512, a determination is made as to whether the outputted robustness score(s) meets one or more predetermined criteria. If it is determined at 512 that the robustness score(s) fail to meet the predetermined criteria, then the process is iterated until the criteria is met. Once the robustness score(s) are found to satisfy the predetermined criteria, at 514, one or more visualizations are presented to the user (e.g., via presentation component 414). Various suitable visualizations may be presented to the user such as, for example, charts, analytical reports, summary description of key features, and or others.

In some embodiments of the present invention, the robustness score is established via the calculation of a z-score, in which the z-score defines the ratio of margin to variation. The higher the z-score, the more robust the component is and vice-versa. The z-score can be calculated by:

$$Z = \frac{\text{Spec Limit} - \text{Mean}}{\text{Standard Deviation}} = \frac{SL - \mu}{\partial} = \frac{\text{Design Margin}}{\text{Variation}}.$$

In the formula above, SL represents design requirements such as a specification limit (e.g., upper limit, lower limit, etc.), $\mu$ represents the design nominal, and $\partial$ represents the process capability. Thus if for an example deterministically designed product one assumes a design nominal of 300, a spec limit of 360 and a variability (i.e., standard deviation) of 20, then a z-score would result that is equal to 3, with a probability of defect p(d) being equal to 0.00135. Similarly, if for an example robust designed product one assumes a design nominal of 300, a spec limit of 360 and a variability (i.e., standard deviation) of 5, then a z-score would result that is equal to 6, with a probability of defect p(d) being equal to $9.86e^{-10}$.

Figure 6:
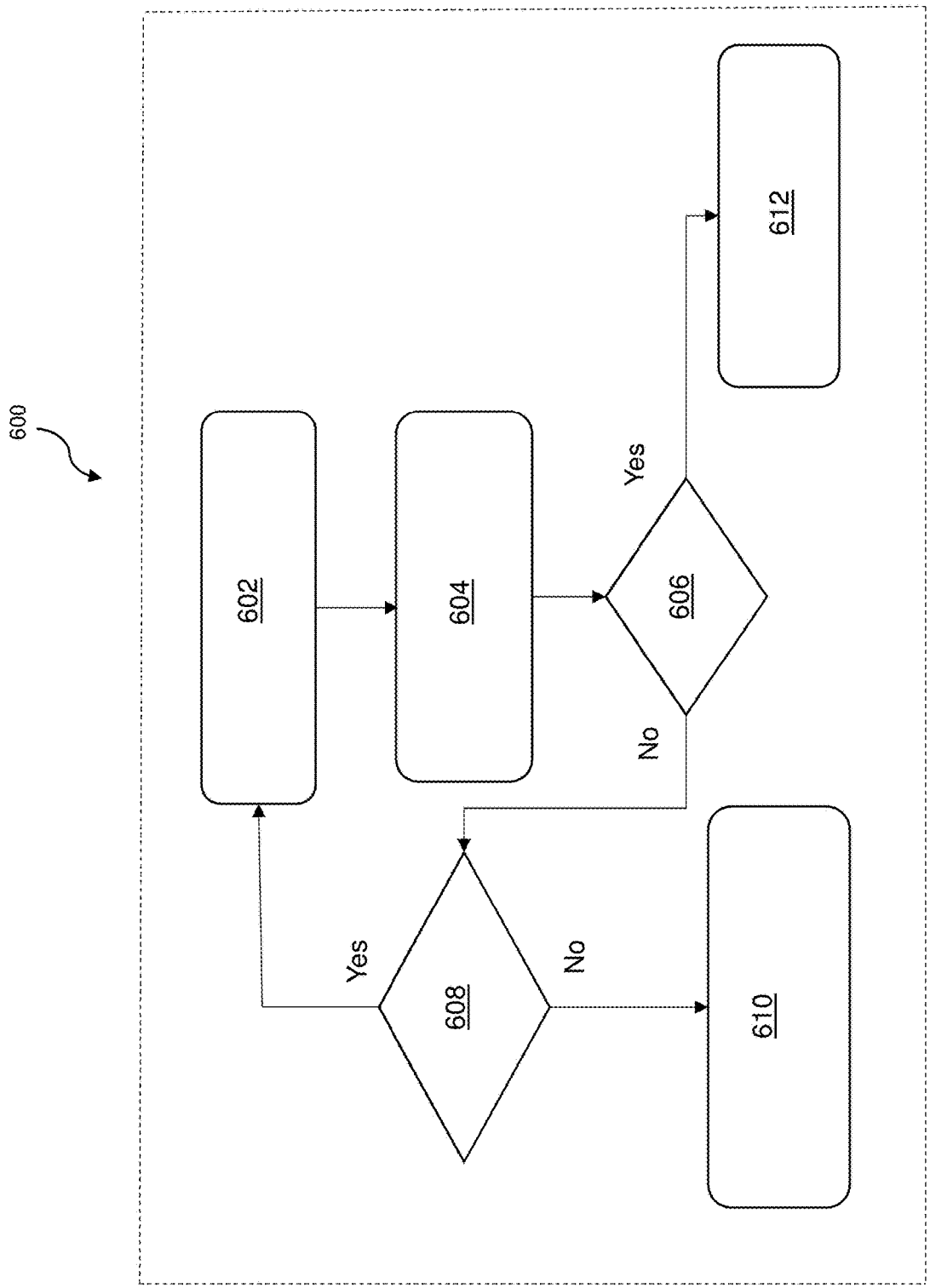
FIG. 6 depicts a flow diagram illustrating an example methodology for generating robustness scores and a robustness scorecard in accordance with one or more embodiments of the present invention.

FIG. 6 illustrates an example methodology 600 that is performable by robustness evaluation system 404 for generating robustness scores and a robustness scorecard in accordance with one or more embodiments of the present invention. In some embodiments of the present invention, methodology 600 is performed as part of step 510 of FIG. 5. Referring to FIG. 6, at 602, the engineering responses and probabilistic samples are obtained from the multifidelity approach. At 604, the probabilistic samples and/or the engineering responses are analyzed for statistical correctness and/or to look into the normality of the data. In some embodiments of the present invention, the deviation of data from normality is computed by conducting various types of s such as, for example, Anderson-Darling. At 606, a determination is made as to whether the data is normally distributed or not, which is used to decide in real-time what metric should be used for calculating the robustness score. If at 606 it is determined that the data (e.g., results of the engineering response(s)) is normally distributed, at 612, the metric used to calculate the robustness scores is selected as being a z-metric and robustness scores are then generated using the z-score (e.g., robustness scores generated at 512 in in methodology 500). If at 606 it is determined that the data is not normally distributed, then at 608 a determination is made as to if the input uncertainty of the probabilistic samples can be reduced. If it is determined at 608 that the input uncertainty can be reduced, then further probabilistic samples are obtained at 602 and the process is iterated based on changing, for example, the sampling rage utilized by the optimal stratified sampling algorithm. If it is determined at 608 that the input uncertainty cannot be reduced, then at 610 the metric used to calculate the robustness scores is selected as being a standard failure rate definition and then the robustness scores are generated using the standard failure rate definition. In some embodiments of the present invention, the standard failure rate definition is the ratio of the number samples not meeting engineering criteria to the total number of samples investigated. In some embodiments of the present invention, step 608 (and/or other steps) are skipped and/or not performed. For example, in some embodiments of the present invention, if at 606 it is determined that the data is not normally distributed, then at 610 the standard failure rate definition is utilized to generate the robustness scores without first performing step 608.

Table 4 below illustrates an example of a robustness scorecard that is presented to the user in accordance with one or more embodiments of the present invention, in which the robustness scorecard quantifies a robustness score for each engineering concept (e.g., feature position) for an example engineering scenario.

TABLE 4

Example Robustness Scorecard

| | Input parameters | Mean | Stdev | | | |
|---|---|---|---|---|---|---|
| Random Variable | X1 | 1810000 | 10000 | | | |
| Random Variable | X2 | 2108000 | 10000 | | | |
| Random Variable | X3 | 0.0022 | 0.0004 | | | |
| Random Variable | X4 | 714 | 10 | | | |
| Random Variable | X5 | 729 | 16.6 | | | |

| Feature position | Output parameters | Mean | Standard deviation | Upper spec limit | Z (process capability) | Probability of failure |
|---|---|---|---|---|---|---|
| 4.8 | Y | 799.35 | 50.42 | 923 | 2.45 | 0.007099 |
| 5.1 | Y | 780.24 | 17.13 | 923 | 8.32 | 0 |
| 5.308 | Y | 778.37 | 13.52 | 923 | 10.69 | 0 |

As can be seen above, for a given set of input random variables and processing through a numerical sampling algorithm, a score card is generated that includes an estimated robustness score for each concept description. In the context of the example engineering scenario set forth in Table 4, robustness is being evaluated at three different feature locations. It can be seen that for feature position at 4.8 m, the engineering component exhibits least robustness, while at feature position at 5.308 m the engineering component exhibits a maximum robustness. Accordingly, the probability of failure of the engineering component is determined to be highest for feature position at 4.8 m and is lowest for feature position at 5.308 m, in which the failure probability is inversely proportional to the calculated z-score.

Figure 7:
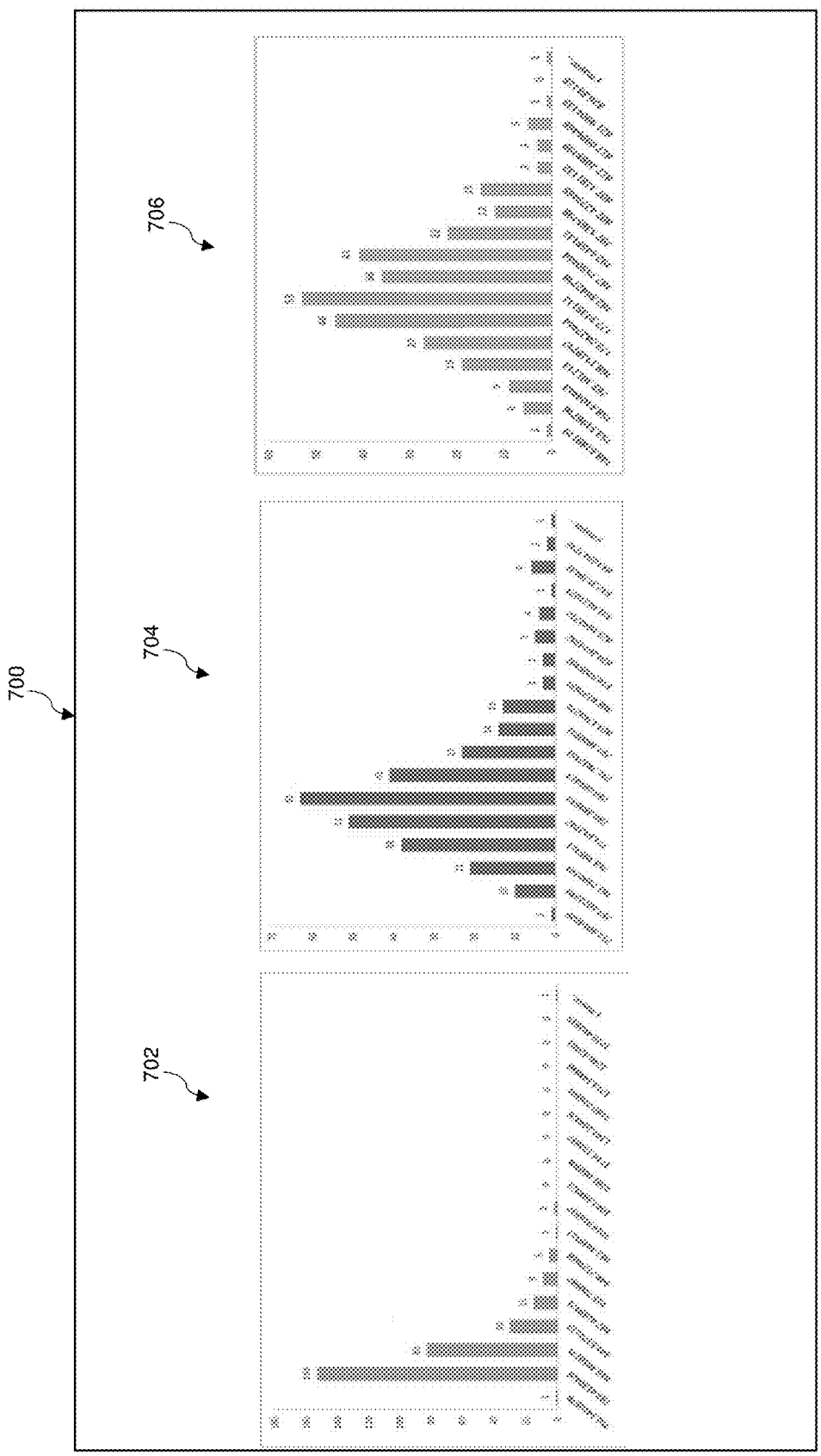
FIG. 7 depicts a diagram of an example graphical user interface in accordance with one or more embodiments of the present invention, in which the graphical user interface presents a visual representation of variability in an engineering response.

FIG. 7 illustrates an example graphical user interface 700 that may be presented in accordance with one or more embodiments of the present invention to present a visual representation of variability of an engineering response for a set of different engineering concepts (e.g., feature positions). Graphical user interface 700 displays a bar graph for each engineering concept (e.g., feature position) that was evaluated. In the example shown in FIG. 7, graphical user interface 700 includes a first bar graph 702, a second bar graph 704, and a third bar graph 706, in which each bar graph is associated with a particular feature position. Here, the first bar graph 702 demonstrates the variability of the output parameters of the scorecard for feature position at 4.8 m. The second bar graph 704 demonstrates the variability of the output parameters of the scorecard for feature position at 5.1 m. The third bar graph 706 demonstrates the variability of the output parameters of the scorecard for feature position at 5.3 m. The displayed visualization demonstrates that at feature position 5.308 m the engineering component exhibits the least amount of variability and has a balanced distribution around the mean. Other suitable visualizations may be presented via graphical user interface 700 such as, for example, a line graph representing a curve.

Figure 8:
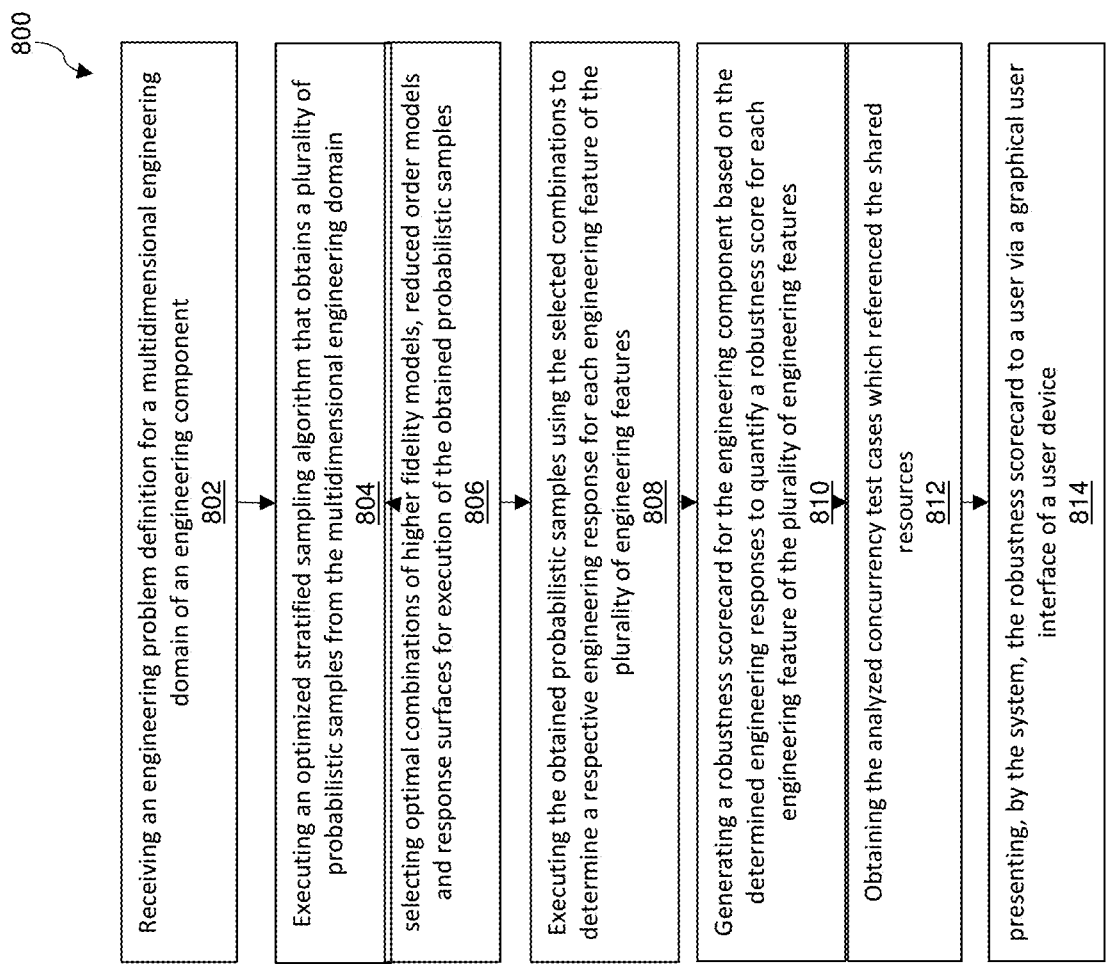
FIG. 8 depicts a flow diagram illustrating another example methodology in accordance with one or more embodiments of the present invention.

Additional details of the operation of robustness evaluation system 404 will now be described with reference to FIG. 8, wherein FIG. 8 depicts a flow diagram illustrating a methodology 800 according to one or more embodiments of the present invention. At 802, an engineering problem definition for a multidimensional engineering domain of an engineering component is received, in which the engineering problem definition includes a description of a plurality of engineering features of the engineering component. At 804, an optimal stratified sampling algorithm is executed that obtains a plurality of probabilistic samples from the multi-dimensional engineering domain. At 806 optimal combinations of higher fidelity models, reduced order models and response surfaces for execution of the obtained probabilistic samples are selected. At 808, the obtained probabilistic samples are executed using the selected combinations to determine a respective engineering response for each engineering feature of the plurality of engineering features. At 810, a robustness scorecard for the engineering component is generated based on the determined engineering responses to quantify a robustness score for each engineering feature of the plurality of engineering features. At 812, the analyzed concurrently test cases which referenced the shared resources is obtained. At 814, the robustness scorecard is presented to a user via a graphical user interface of a user device.

In some embodiments of the present invention, the selection of the combinations is based on meeting a predetermined time constraint. For example, in some embodiments of the present invention, the higher fidelity models are associated with a first required amount of time, the reduced order models are associated with a second required amount of time, and the response surfaces are associated with a third required amount of time, in which the first amount of time is higher than the second and third amount of times. Thus if a user only has a certain amount of time to execute the probabilistic samples, then an optimal combination is selected such that the probabilistic samples may be obtained within the desired amount of time.

In some embodiments of the present invention, the execution of the optimal stratified sampling algorithm includes dividing the N-dimensional parameter space into a plurality of smaller subspaces via Latin Hypercube sampling, and selecting a sample from each subspace to generate a Latin Hypercube such that the selected samples each have a different coordinate.

In some embodiments of the present invention, the execution of the optimal stratified sampling algorithm further includes compressing the Latin Hypercube for a region of interest and executing an optimizer that creates a set of configurable samples across the multidimensional engineering domain based on the compressed Latin Hypercube.

In some embodiments of the present invention, the generation of the scorecard includes analyzing a statistical correctness of the probabilistic samples by computing a deviation of data of the engineering responses from normality, and selecting a metric for calculating the robustness score, in which the metric is selected based on whether the data is normal. In some embodiments of the present invention, the selected metric is a z-score calculation for cases where the data is normal. In some embodiments of the present invention, the selected metric is a standard failure rate definition for cases where the data is non-normal. In some embodiments of the present invention, the standard failure rate definition is based on the ratio of the number of samples that did not meet predetermined engineering criteria to the total number of samples that were investigated.

In some embodiments of the present invention, methodology 800 further includes, determining whether the robustness scorecard meets a predetermined criteria, in which the predetermined criteria defines at least one of an acceptable probability of failure or an acceptable error in variance estimation. In some embodiments of the present invention, the determination is performed prior to presenting the robustness scorecard to the user. In some embodiments of the present invention, the robustness scorecard is presented to the user upon determining that the robustness scorecard meets the predetermined criteria. In some embodiments of the present invention, upon determining that the robustness scorecard does not meet the predetermined criteria, a configuration of the optimal stratified sampling algorithm is changed. In some embodiments of the present invention, the optimal stratified sampling algorithm is changed such that a different number of samples (e.g., different sample range) are obtained by the optimal stratified sampling algorithm. In some embodiments of the present invention, the optimal stratified sampling algorithm is changed by changing the problem definition or variables. After having changed the optimal stratified sampling algorithm using one or more of the steps identified above, the optimal stratified sampling algorithm is executed to obtain a second plurality of probabilistic samples from the multidimensional engineering domain and one or more steps of the process above is repeated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for evaluating robustness of an engineering component comprising:
   receiving, by a system comprising one or more processors, an engineering problem definition for a multidimensional engineering domain of the engineering component, wherein the engineering problem definition includes a description of a plurality of engineering features of the engineering component;
   executing, by the system, an optimal stratified sampling algorithm to obtain a plurality of probabilistic samples from the multidimensional engineering domain;
   selecting, by the system, combinations of higher fidelity models, reduced order models and response surfaces for execution of the obtained probabilistic samples;
   executing, by the system, the obtained probabilistic samples using the selected combinations to determine a respective engineering response for each engineering feature of the plurality of engineering features;
   generating, by the system, a robustness scorecard for the engineering component based on the determined engineering responses, wherein the robustness scorecard provides a robustness score for each engineering feature of the plurality of engineering features, where generating the robustness scorecard comprises:
      analyzing a statistical correctness of the probabilistic samples by computing a deviation of data of the engineering responses from normality; and
      selecting a metric for calculating each robustness score, wherein the metric is selected based on whether the data is normal; and
   presenting, by the system, the robustness scorecard to a user via a graphical user interface of a user device.

2. The computer-implemented method of claim 1, wherein the execution of the optimal stratified sampling algorithm includes:
   dividing the N-dimensional parameter space into a plurality of smaller subspaces via latin hypercube sampling, wherein the division is stratified based on a type of distributions specified on variables of interest; and
   selecting a sample from each subspace to generate a latin hypercube, wherein the selected samples each have a different coordinate.

3. The computer-implemented method of claim 2, wherein the execution of the optimal stratified sampling algorithm further includes:
   compressing the latin hypercube for a region of interest; and
   executing an optimizer that creates a set of configurable samples across the multidimensional engineering domain based on the compressed latin hypercube.

4. The computer-implemented method of claim 1, wherein the selected metric is a z-score calculation if the data is normal, wherein selected metric is a standard failure rate definition if the data is non-normal, and wherein the standard failure rate definition is based on a ratio of number of samples that do not meet predetermined engineering criteria to total number of samples investigated.

5. The computer-implemented method of claim 1 further comprising:
   prior to presenting the robustness scorecard to the user, determining whether the robustness scorecard meets a predetermined criteria, wherein the predetermined criteria defines at least one of an acceptable probability of failure or an acceptable error in variance estimation; and
   upon the determining that the robustness scorecard meets the predetermined criteria, presenting the robustness scorecard to the user; or
   upon determining that the robustness scorecard does not meet the predetermined criteria, changing a configuration of the optimal stratified sampling algorithm, and executing the optimal stratified sampling algorithm to obtain a second plurality of probabilistic samples from the multidimensional engineering domain.

6. The computer-implemented method of claim 1, wherein the selection of the combinations is based on meeting a predetermined time constraint.

7. A computer program product for evaluating robustness of an engineering component, the computer program product comprising a computer readable storage medium having program instructions embodied therewith, the program instructions executable by a system comprising one or more processors to cause the system to perform a method, the method comprising:

receiving, by the system, an engineering problem definition for a multidimensional engineering domain of the engineering component, wherein the engineering problem definition includes a description of a plurality of engineering features of the engineering component;

executing, by the system, an optimal stratified sampling algorithm to obtain a plurality of probabilistic samples from the multidimensional engineering domain;

selecting, by the system, combinations of higher fidelity models, reduced order models and response surfaces for execution of the obtained probabilistic samples;

executing, by the system, the obtained probabilistic samples using the selected combinations to determine a respective engineering response for each engineering feature of the plurality of engineering features;

generating, by the system, a robustness scorecard for the engineering component based on the determined engineering responses, wherein the robustness scorecard provides a robustness score for each engineering feature of the plurality of engineering features, where generating the robustness scorecard comprises:

analyzing a statistical correctness of the probabilistic samples by computing a deviation of data of the engineering responses from normality; and selecting a metric for calculating each robustness score, wherein the metric is selected based on whether the data is normal; and presenting, by the system, the robustness scorecard to a user via a graphical user interface of a user device.

8. The computer program product of claim 7, wherein the execution of the optimal stratified sampling algorithm includes:

dividing the N-dimensional parameter space into a plurality of smaller subspaces via latin hypercube sampling, wherein the division is stratified based on a type of distributions specified on variables of interest; and selecting a sample from each subspace to generate a latin hypercube, wherein the selected samples each have a different coordinate.

9. The computer program product of claim 8, wherein the execution of the optimal stratified sampling algorithm further includes:

compressing the latin hypercube for a region of interest; and executing an optimizer that creates a set of configurable samples across the multidimensional engineering based on the compressed latin hypercube.

10. The computer program product of claim 7, wherein the selected metric is a z-score calculation if the data is normal, wherein selected metric is a standard failure rate definition if the data is non-normal, and wherein the standard failure rate definition is based on a ratio of number of samples that do not meet predetermined engineering criteria to total number of samples investigated.

11. The computer program product of claim 7, wherein the method further includes:

prior to presenting the robustness scorecard to the user, determining whether the robustness scorecard meets a predetermined criteria, wherein the predetermined criteria defines at least one of an acceptable probability of failure or an acceptable error in variance estimation; and upon the determining that the robustness scorecard meets the predetermined criteria, presenting the robustness scorecard to the user; or upon determining that the robustness scorecard does not meet the predetermined criteria, changing a configuration of the optimal stratified sampling algorithm, and executing the optimal stratified sampling algorithm to obtain a second plurality of probabilistic samples from the multidimensional engineering domain.

12. The computer program product of claim 7, wherein the selection of the combinations is based on meeting a predetermined time constraint.

13. A system for evaluating robustness of an engineering component, the system comprising one or more processors configured to perform a method, the method comprising:

receiving, by the system, an engineering problem definition for a multidimensional engineering domain of the engineering component, wherein the engineering problem definition includes a description of a plurality of engineering features of the engineering component;

executing, by the system, an optimal stratified sampling algorithm to obtain a plurality of probabilistic samples from the multidimensional engineering domain;

selecting, by the system, combinations of higher fidelity models, reduced order models and response surfaces for execution of the obtained probabilistic samples;

executing, by the system, the obtained probabilistic samples using the selected combinations to determine a respective engineering response for each engineering feature of the plurality of engineering features;

generating, by the system, a robustness scorecard for the engineering component based on the determined engineering responses, wherein the robustness scorecard provides a robustness score for each engineering feature of the plurality of engineering features, where generating the robustness scorecard comprises:

analyzing a statistical correctness of the probabilistic samples by computing a deviation of data of the engineering responses from normality; and selecting a metric for calculating each robustness score, wherein the metric is selected based on whether the data is normal; and presenting, by the system, the robustness scorecard to a user via a graphical user interface of a user device.

14. The system of claim 13, wherein the execution of the optimal stratified sampling algorithm includes:

dividing the N-dimensional parameter space into a plurality of smaller subspaces via latin hypercube sampling, wherein the division is stratified based on a type of distributions specified on variables of interest; and selecting a sample from each subspace to generate a latin hypercube, wherein the selected samples each have a different coordinate.

15. The system of claim 14, wherein the execution of the optimal stratified sampling algorithm further includes:

compressing the latin hypercube for a region of interest; and executing an optimizer that creates a set of configurable samples across the multidimensional engineering domain based on the compressed latin hypercube.

16. The system of claim 13, wherein the selected metric is a z-score calculation if the data is normal, wherein selected metric is a standard failure rate definition if the data is non-normal, and wherein the standard failure rate definition is based on a ratio of number of samples that do not meet predetermined engineering criteria to total number of samples investigated.

17. The system of claim 13, wherein the method further includes:
- prior to presenting the robustness scorecard to the user, determining whether the robustness scorecard meets a predetermined criteria, wherein the predetermined criteria defines at least one of an acceptable probability of failure or an acceptable error in variance estimation; and
- upon the determining that the robustness scorecard meets the predetermined criteria, presenting the robustness scorecard to the user; or
- upon determining that the robustness scorecard does not meet the predetermined criteria, changing a configuration of the optimal stratified sampling algorithm, and executing the optimal stratified sampling algorithm to obtain a second plurality of probabilistic samples from the multidimensional engineering domain.

\* \* \* \* \*